(12) United States Patent
Imai

(10) Patent No.: US 7,714,336 B2
(45) Date of Patent: May 11, 2010

(54) LED DEVICE AND METHOD BY WHICH IT IS PRODUCED

(75) Inventor: Yuji Imai, Kanzaki-gun (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 19 days.

(21) Appl. No.: 12/115,078

(22) Filed: May 5, 2008

(65) Prior Publication Data

US 2008/0283849 A1    Nov. 20, 2008

(30) Foreign Application Priority Data

May 16, 2007    (JP) .............................. 2007-130342

(51) Int. Cl.
*H01L 33/00*    (2010.01)
(52) U.S. Cl. .............................. 257/88; 257/89; 257/98; 257/99; 257/E33.025
(58) Field of Classification Search .................. 257/88, 257/89, 98, 99, E33.025, E33.028
See application file for complete search history.

(56) References Cited

U.S. PATENT DOCUMENTS

2004/0201029 A1    10/2004    Yamane et al.
2005/0016632 A1    1/2005    Tomizawa et al.
2008/0083993 A1*    4/2008    Zeng et al. ................... 257/777
2009/0095975 A1*    4/2009    Shin et al. ...................... 257/99

FOREIGN PATENT DOCUMENTS

| JP | 2000-077464 A | 3/2000 |
| JP | 2002-298963 A | 2/2002 |
| JP | 2003-301203 A | 10/2003 |
| JP | 2004-128330 A | 4/2004 |
| JP | 2004-134797 A | 4/2004 |
| JP | 2004-327982 A | 11/2004 |

* cited by examiner

*Primary Examiner*—Thien F Tran
(74) *Attorney, Agent, or Firm*—David S. Safran; Roberts Mlotkowski Safran & Cole, P.C.

(57) ABSTRACT

A LED device formed of LED chips bonded to an exoergic member by the LED chips being bonded to an Au—Sn alloy layer formed on an upper surface of the exoergic member with columnar crystals being formed within the Au—Sn alloy layer extending in a direction perpendicular to the upper surface of the exoergic member. The method of producing the LED device forms an Sn film directly on the upper surface of the exoergic member, an Au film on a lower surface of the LED chips, mounts the LED chips with the Au film thereon onto the Sn film formed on the upper surface of the exoergic member, and the exoergic member with LED chips mounted thereon is heated in an atmosphere in which a forming gas flows, so that the LED chips are bonded to the exoergic member.

4 Claims, 6 Drawing Sheets

LED DEVICE AND METHOD BY WHICH IT IS PRODUCED

BACKGROUND OF THE INVENTION

1. Field of Invention

This invention concerns an LED device and a method by which it is produced. More specifically, it concerns an LED device used as a light source in display equipment, lighting equipment, and so on, and its method of production.

2. Description of Related Art

LED devices formed by bonding LED chips to exoergic members have been used as light sources in display equipment, lighting equipment, and so on in recent years; in these LED devices, a silicon resin or other resin is commonly used as a bonding material to bond the LED chips to exoergic members made of aluminum nitride (AlN), silicon carbide (SiC), Copper (Cu), or aluminum (Al), for example, or to lighting fixtures that function as exoergic members.

There is the problem, however, that because the resin used as a bonding material that forms the bonds between the LED chips and the exoergic members have inadequate heat resistance, a heat-resistance temperature of 100° C. or less, for example, bonds in the LED device deteriorate due to the heat from the LED chips and film cracks occur. Further, the heat generated by the LED chips in the LED device is not conducted across the bonds, and so the desired exoergic properties cannot be achieved, and this has a deleterious effect on increased brightness.

Therefore, it has been proposed that a eutectic alloy, such as Au—Sn alloy (gold-tin alloy), be used instead of resin as the bonding material between the LED chip and the exoergic member (see, Japanese Pre-grant Patent Publication 2004-134797).

Figure 11:
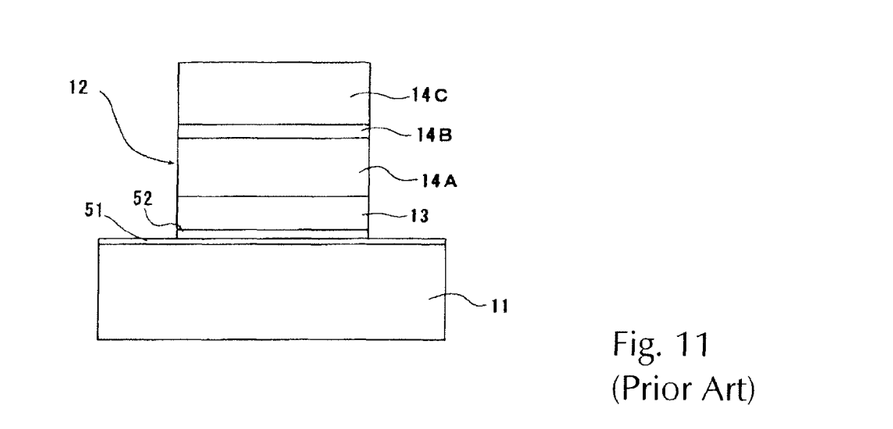
FIG. 11 shows the construction of the LED device of Japanese Pre-grant Patent Publication 2004-134797.

In Japanese Pre-grant Patent Publication 2004-134797, as shown in FIG. 11, an Au (gold) layer 51 is formed over the full upper surface of the exoergic member 11 (the upper surface in FIG. 11), a bond comprising an alloy layer 52 is formed on that Au layer 51 by means of a bonding material that comprises an eutectic alloy, such as an Au—Sn alloy, and the LED device 12 is bonded.

In the example shown in FIG. 11, the LED device 12 is produced by forming a nitride semiconductor layer by stacking an n-type semiconductor layer 14A, a light-emitting layer 14B and a p-type semiconductor layer 14C in that order on a sapphire substrate 13.

In testing by the present inventors, however, the problem was revealed that, when bonds are formed using an Au—Sn alloy layer as the bonding material on an exoergic member 11 on which an Au layer 51 is formed, metal diffusion occurs in the heat treatment process to bond the LED device 12, diffusion of tin atoms of the Au—Sn alloy layer into the Au layer 51 causes reduction of the bonding strength between the LED device 12 and the exoergic member 11, and peeling occurs.

SUMMARY OF THE INVENTION

In view of the foregoing, the present inventors investigated the procedure of bonding LED chips by forming a vapor deposition layer of Au—Sn alloy directly on the upper surface of the exoergic member. It became clear that in this procedure, if an Au—Sn alloy vapor deposition layer is patterned on the upper surface of the exoergic member in order to bond multiple LED chips to a single exoergic member, variation of the composition ratio (the proportions in the construction) of the Au—Sn alloy vapor deposition layer of the patterning will occur, and so the heat treatment temperature needed on the exoergic member will be uneven and it will be difficult to bond multiple LED chips simultaneously.

When the variation of the composition ratio of the patterned Au—Sn alloy vapor deposition layer was analyzed, it was ascertained that the weight ratio reached ±5% to 20%. Further, it was learned that, because it is necessary to apply pressure to the LED chip in this procedure along with heating to bond the LED chip to the exoergic member, unevenness of pressure is a major problem when multiple LED chips are bonded simultaneously.

This invention was made in consideration of the situation described above; its purpose is to provide an LED device that has superior exoergic properties and that has a structure capable of simultaneous bonding of multiple LED chips to an exoergic member, and a method of production of such devices.

The LED device of this invention is an LED device constituted with an LED chip bonded on an exoergic member, in which the LED chip is bonded to an Au—Sn alloy layer formed on the upper surface of the exoergic member and columnar crystals are formed to extend in a direction perpendicular to the upper surface of the exoergic member within that Au—Sn alloy layer.

In the LED device of this invention, multiple LED chips can be bonded to a common exoergic member.

In the LED device of this invention, it is preferable that the LED chip have a nitride semiconductor layer stacked on the upper surface of a sapphire substrate and that the lower surface of the sapphire substrate be bonded to the exoergic member.

The LED device of this invention can be one in which the common exoergic member comprises a silicon substrate and a red-light-emitting LED, a green-light-emitting LED and a blue-light-emitting LED are each bonded to the upper surface of the common exoergic member that comprises a silicon substrate.

The LED device production method of this invention is one that produces LED devices constituted with LED chips bonded to an exoergic member, in which there is a process that forms an Sn (tin) film directly on the upper surface of the exoergic member, a process that forms an Au (gold) film on the lower surface of the LED chips, a process that mounts the LED chips with an Au film on the Sn film formed on the upper surface of the exoergic member, and a process in which the exoergic member with LED chips mounted is heated in an atmosphere in which a forming gas flows, and the LED chips are bonded to the exoergic member.

In the LED device production method of this invention, it is possible for multiple Sn films to be patterned on the upper surface of a common exoergic member and multiple LED chips to be simultaneously mounted on their respective multiple patterned Sn films on the upper surface of the common exoergic member by heating the common exoergic member on which the LED chips are mounted.

Using the LED device of this invention, the LED chips are bonded directly to the exoergic member by means of the Au—Sn alloy layer and the Au—Sn alloy layer forms columnar crystals, so that high light-emitting efficiency relative to the current is achieved and there is a strong bond between the exoergic member and the LED chip, besides which superior heat resistance and thermal conductivity are achieved in the bonds that comprise the Au—Sn alloy layer, with the result that the heat generated by the LED chips is conducted across the bonds to the exoergic member, heat is adequately radiated by the exoergic member, and superior heat release is obtained.

Further, in the production of the LED device of this invention, because the Au—Sn alloy layer that produces the bond is formed by alloying Sn and Au from the Sn film formed on the upper surface of the exoergic member and the Au film formed on the lower surface of the LED chip, there is no need for preparatory formation of an Au—Sn alloy, on either the exoergic member or the LED chip, in order to obtain the Au—Sn alloy layer. Besides that, the Sn film, the Au film, and the LED chip are stacked on the upper surface of the exoergic member in that order, so that the LED chip is bonded, by its own weight, to the exoergic member by way of the Au—Sn alloy layer formed by the alloying of Sn and Au, there is no need to apply pressure to the LED chip.

Accordingly, when multiple LED chips are to be bonded to the exoergic member simultaneously, it is possible to pattern the Sn layer on the upper surface of the exoergic member without inviting deterioration, and the LED chips are bonded to the exoergic member without application of pressure, with the result that deterioration caused by uneven application of pressure can be avoided.

This being the case, the LED device of this invention has a structure that allows simultaneous bonding of multiple LED chips to an exoergic member. It is possible, moreover, to increase brightness by means of a construction in which multiple LED chips are bonded to an exoergic member in this way.

Further, using the LED device of this invention, it is possible to increase brightness by increasing the number of LED chips bonded to the exoergic member and so it is possible, while increasing brightness, to reduce the current supplied to each LED chip; this makes it possible to suppress the heat generated by the LED chips and it is possible, as a result, to obtain longer service life and higher quality.

Using the LED device production method of this invention, it is possible to mount LED chips on the exoergic member by forming single-metal films—an Sn film on the exoergic member and an Au film on the LED chip—and aligning these films to match up, alloying the Sn and Au by heating, and forming joints that comprise an Au—Sn alloy layer. Thus, when multiple LED chips are to be mounted on an exoergic member, it is possible to form the Sn film in patterns on the exoergic member without inviting deterioration, and it is possible, by bonding the LED chips to the exoergic member without applying pressure, to avoid deterioration caused by uneven application of pressure. Thus it is possible to bond multiple LED chips to the exoergic member simultaneously.

Further, using this production method makes it possible to achieve higher light-emitting efficiency relative to the current, and to obtain LED devices that have stronger bonds between the exoergic member and the LED chips and that have superior exoergic properties.

This invention is explained in detail below.

DETAILED DESCRIPTION OF THE INVENTION

Figure 1:
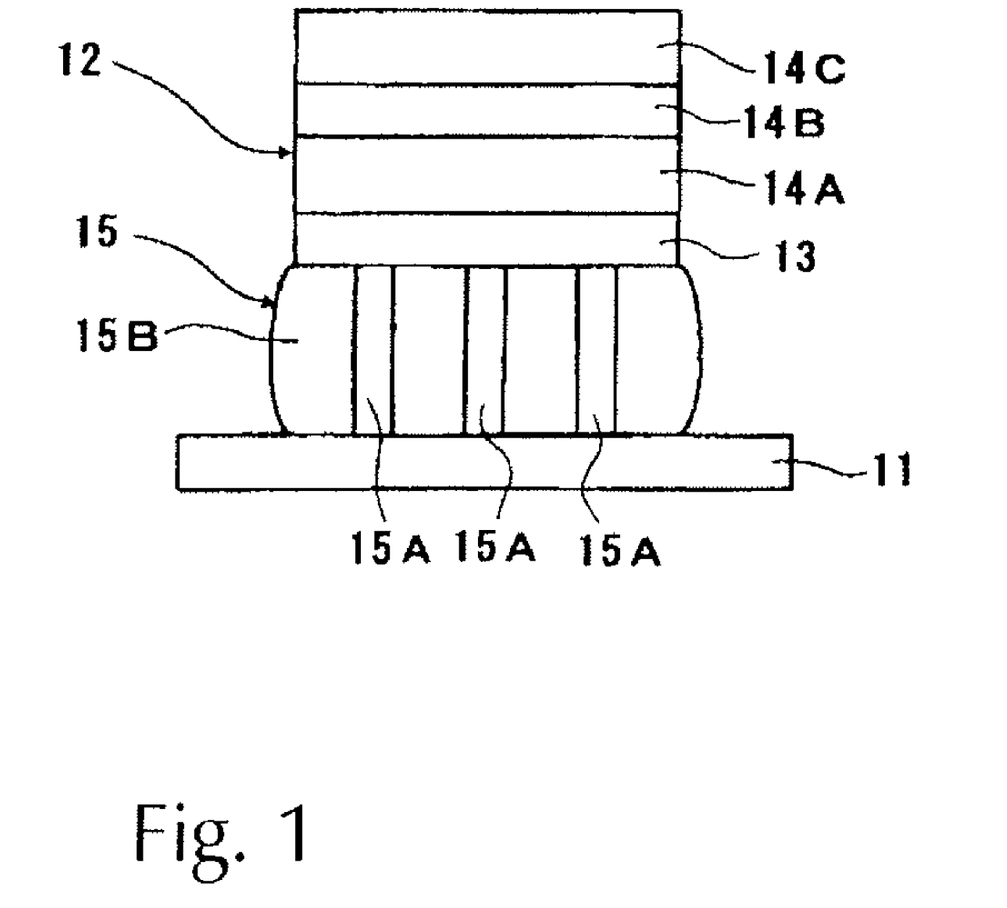
FIG. 1 is an explanatory drawing that shows the construction of the LED device of this invention.

FIG. 1 is an explanatory drawing that shows the construction of the LED device of this invention. This LED device has a construction in which an LED device 12 is bonded by means of an Au—Sn alloy (gold-tin alloy) layer 15 that is formed on the upper surface of the exoergic member 11 in FIG. 1, the exoergic member being a flat plate.

Within the Au—Sn alloy layer 15, that constitutes the bond between the exoergic member 11 and the LED device 12, is formed with columnar crystals 15A that extend perpendicular to the upper surface of the exoergic member 11 (the up/down direction in FIG. 1).

These columnar crystals 15A are made of Au—Sn alloy and are formed within an Sn (tin) layer 15B.

The Au—Sn alloy layer 15 having such a construction is formed during production of the LED device by the Sn film formed directly on the upper surface of the exoergic member 11 and the Au (gold) film formed directly on the lower surface (the lower surface in FIG. 1) of the LED device 12.

The LED device 12 has a construction of nitride semiconductor layers stacked on a sapphire substrate 13. The layers of the nitride semiconductor are an n-type semiconductor layer 14A which is n-GaN comprising GaN (gallium nitride) doped with P (phosphorus), Te (tellurium), or Se (selenium), for example, a light-emitting layer 14B which is InGaN, and a p-type semiconductor layer 14C which is p-GaN comprising GaN (gallium nitride) doped with elements such as Zn (zinc) or C (carbon), stacked in that order on a sapphire substrate 13.

Further, the sapphire substrate 13 is the bottom-most layer of the LED device 12; this lower surface of the sapphire substrate 13 is bonded to the exoergic member 11.

The exoergic member can be made of aluminum nitride (AlN), silicon carbide (SiC), copper (Cu), aluminum (Al), or silicon (Si); aluminum nitride is preferable from the perspectives of heat radiation and adhesion of the Sn film formed in the production process.

Figure 2:
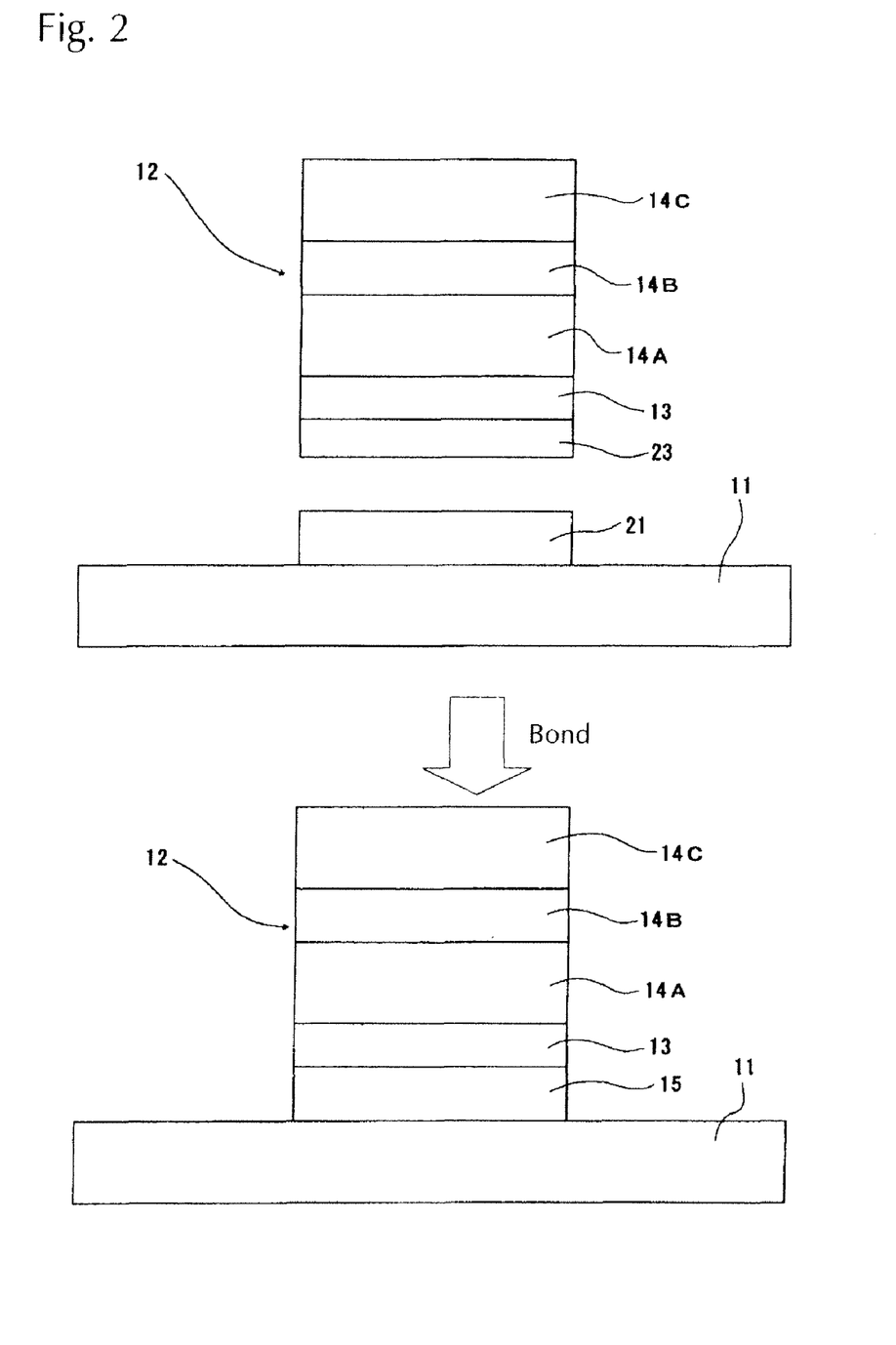
FIG. 2 is an explanatory drawing that shows the process of producing the LED device of FIG. 1.

As shown in FIG. 2, the LED device 12 can be produced by forming an Sn film 21 on the upper surface of the exoergic member 11 (upper surface in FIG. 2) and an Au film 23 on the lower surface of the LED device 12 (lower surface in FIG. 2—that is, on the lower surface of the sapphire substrate 13—then, mounting the LED chip on which the Au film 23 is formed on the Sn film 21 formed on the upper surface of the exoergic member and heating the exoergic member 11 on which this LED device 12 is mounted.

In other words, by means of an exoergic member Sn film formation process that forms an Sn film 21 directly on the upper surface of the exoergic member 11, an Au LED chip film formation process that forms an Au film 23 on the lower surface of the LED device 12, a mounting process that mounts the LED device 12 on which an Au film 23 is formed, with the Au film 23 downward, on the Sn film 21 formed on the upper surface of the exoergic member 11, and a bonding process that heats the exoergic member 11 on which the LED devices 12 are mounted in a forming gas atmosphere that comprises a mixture of hydrogen gas and nitrogen gas, an Au—Sn alloy layer 15 is formed by the Sn film 21 formed on the upper surface of the exoergic member 11 and the Au film 23 formed on the lower surface of the LED devices 12; as a result, an LED device is obtained having a construction in which the LED devices 12 are bonded by an Au—Sn alloy formed on the upper surface of the exoergic member 11.

In the exoergic member Sn film formation process, the Sn film 21 formed on the upper surface of the exoergic member 11 is formed by EB vapor deposition (electron beam vapor deposition), for example, and the film thickness is generally from 1 to 8 μm, 3 μm, for example.

Further, the Sn film 21 is formed in an LED chip bonding region that has a shape matching the shape of the lower surface of the LED device 12 to be bonded, and preferably has a shape matching the LED chip bonding region.

In the LED chip Au film formation process, the Au film 23 formed on the lower surface of the LED device 12 is formed by EB vapor deposition, for example, and the film thickness is generally from 0.1 to 1.0 μm, 0.2 μm for example.

Further, the Au film 23 is generally formed on the full lower surface of the LED device 12.

In the mounting process, the LED device 12 on which an Au film 23 has been formed is mounted, with the Au film 23 downward, on the Sn film 21 formed on the upper surface of the exoergic member 11, so that the LED device 12 is placed on the exoergic member 11 with the Sn film 21 formed on the exoergic member 11 and the Au film 23 formed on the LED chip located between them.

In the bonding process, the exoergic member 11 with LED devices 12 mounted is placed in a heat treatment, for example, and an influx of forming gas into the heat treatment vessel fills the vessel with forming gas, in which state the exoergic member 11 on which the LED devices 12 are mounted is heated.

And so, by means of heating the exoergic member 11 on which the LED devices 12 are mounted, an Au—Sn alloy layer 15 is formed by alloying the Sn and the Au in the Sn film and the Au film that are stacked between the exoergic member 11 and the LED devices 12, and by means of the weight of the LED devices 12, the LED devices 12 are bonded to the exoergic member 11 by bonds made of the Au—Sn alloy layer 15

The forming gas used in this bonding process is a mixture of hydrogen gas and nitrogen gas; the hydrogen content of the gas mixture is normally less than 10%, or 5% as one example. Further, the flow rate of the forming gas is, normally, 50 $cm^3$/min to 350 $cm^3$/min, or 300 $cm^3$/min, as one example.

The heat treatment conditions in the bonding process are a heat treatment temperature from 250° C. to 350° C. and treatment time from 1 to 20 minutes, or 300° C. heat treatment temperature for a treatment time of 10 minutes, as one example.

In the bonding process, moreover, the bond is formed by the weight of the LED device 12, and so, there is no real need to apply pressure to the LED device 12, although a pressure from 10 g/$cm^2$ to 50 g/$cm^2$, for example, can be applied.

Using an LED device with such a construction, the LED device 12 is bonded to the exoergic member 11 by means of an Au—Sn alloy layer 15 that is formed directly on the upper surface of the exoergic member, and the Au—Sn alloy layer 15 is one in which columnar crystals 15A are formed. Therefore, high light-emitting efficiency relative to the current is obtained and the bond between the exoergic member 11 and the LED device 12 is strong, besides which the bonds made of the Au—Sn alloy layer 15 have superior heat resistance and thermal conductivity. For that reason, the heat generated by the LED devices 12 is conducted to the exoergic member 11 across the bonds and heat release from the exoergic member 11 is adequate so that superior heat-release characteristics are available.

Further, during production of this LED device, the Au—Sn alloy layer 15 that constitutes the bonds is formed by the alloying of Sn and Au from the Sn film 21 formed on the upper surface of the exoergic member 11 and the Au film 23 formed on the lower surface of the LED devices 12. Because of that, in order to obtain the Au—Sn alloy layer 15, it is enough to form single-metal films on the exoergic member 11 and the LED devices 12; there is no need for advance formation of an Au—Sn alloy layer on either the exoergic member 11 or the LED devices 12. Further, by means of heating the exoergic member 11, when the Sn film 21, Au film 23, and LED device 12 are stacked in that order on its upper surface, the LED device 12 is bonded by its own weight to the exoergic member 11 with the Au—Sn alloy layer 15 that is formed intervening, and so there is no need to apply pressure to the LED device 12.

Consequently, when multiple LED devices 12 are to be bonded to the exoergic member 11 simultaneously, no deterioration results from unevenness of the heat-treatment temperature on the exoergic member arising from variation of the composition ratio of the alloy film obtained, such as is caused by patterning of the Au—Sn alloy layer on the exoergic member. It is possible to pattern the Sn film 21 on the exoergic member 11, and it is possible to prevent deterioration caused by uneven application of pressure by bonding the LED devices 12 to the exoergic member 11 without applying pressure.

This being the case, the LED device of this invention has a structure that allows simultaneous bonding of multiple LED chips to an exoergic member. It is possible, moreover, to increase brightness by means of a construction in which multiple LED chips are bonded to an exoergic member in this way.

Further, using the LED device of this invention it is possible to increase brightness by increasing the number of LED chips bonded to the exoergic member and so it is possible, while increasing brightness, to reduce the current supplied to each LED chip; this makes it possible to suppress the heat generated by the LED chips and it is possible, as a result, to obtain longer service life and higher quality.

An example of an LED device of this invention with a construction in which the multiple LED chips are bonded to a common exoergic member is described below.

Figure 3:
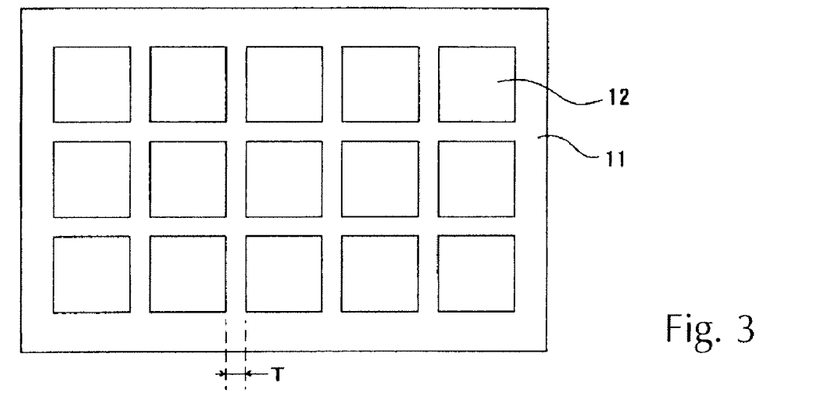
FIG. 3 is an explanatory drawing that shows another example of the construction of the LED device of this invention.

The LED device shown in FIG. 3 has multiple (15) LED devices 12 bonded to an exoergic member 11, and has the same construction as the LED device of FIG. 1, except that the LED devices 12 are bonded to their respective LED chip bonding regions on the common exoergic member 11, which has multiple LED chip bonding regions on its upper surface. The multiple LED devices 12 bonded to the exoergic member 11 are arranged in a lattice-shaped pattern with a gap T separating adjacent LED chips. The gap T can be 20 μm, for example.

Figure 4:
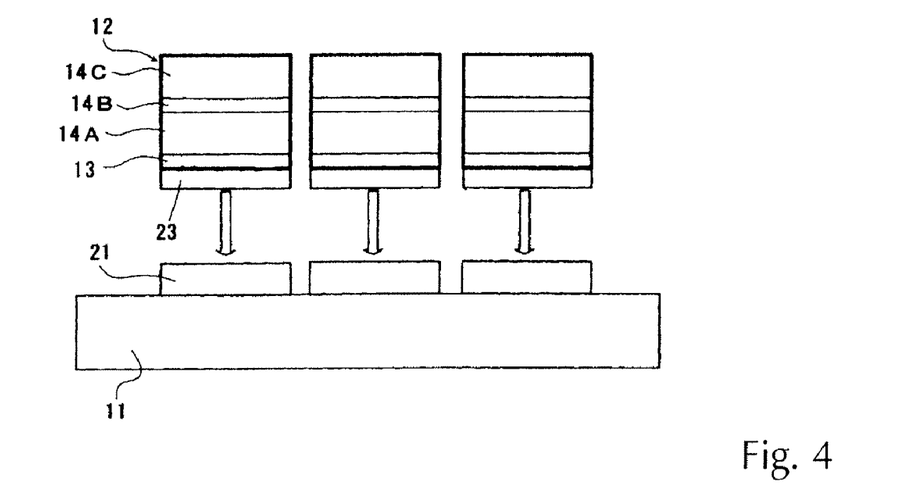
FIG. 4 is an explanatory drawing that shows the process of producing the LED device of FIG. 3.

An LED device having such a construction can be produced, as shown in FIG. 4, through the exoergic member Sn film formation process, the LED chip Au film formation process, the mounting process, and the bonding process in the same way as the LED device shown in FIG. 1.

In the exoergic member Sn film formation process, therefore, it is necessary to form the Sn film on each of multiple LED chip bonding regions on the upper surface of the exoergic member 11, but as a procedure for that, it is possible to do Sn film patterning so as to correspond to the pattern of LED chip bonding regions of the exoergic member 11.

In the heat treatment process, moreover, it is possible to simultaneously bond multiple LED devices 12 mounted on the upper surface of a common exoergic member 11 by heating the common exoergic member 11 when the LED devices 12 with an Au film formed on their lower surfaces are mounted on their respective multiple patterned Sn films.

Figure 5:
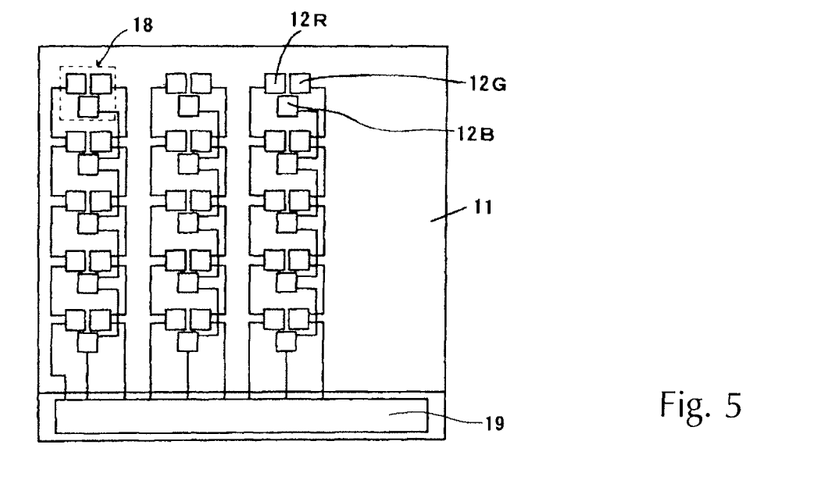
FIG. 5 is an explanatory drawing that shows yet another example of the construction of the LED device of this invention.

The LED device shown in FIG. 5 formed of multiple LED devices 12 bonded to an exoergic member 11; it has the same construction as the LED device of FIG. 3, except that the exoergic member 11 comprises a silicon (Si) substrate and the multiple LED devices 12 are of three varieties—red light-emitting LED devices 12R, green light-emitting LED devices 12G, and blue light-emitting LED devices 12B.

In the example in FIG. 5, 19 is a drive circuit that comprises a common driver IC to drive the LED chips; all of the LED chips that make up the LED device are electrically connected to this drive circuit 19 individually.

The multiple LED chips bonded to the exoergic member 11 form LED chip groups 18 of three chips of different colors—a red light-emitting LED device 12R, a green light-emitting LED device 12G, and a blue light-emitting LED device 12B; these multiple LED chip groups 18 are arranged regularly, in a lattice shape.

In each of the LED chip groups 18, the red light-emitting LED devices 12R, green light-emitting LED devices 12G, and blue light-emitting LED devices 12B are arranged clockwise in that order; the gap T separating adjacent LED chips measures 20 μm, for example.

An LED device having such a construction can be produced using an exoergic member Sn film formation process, an LED chip Au film formation process, a mounting process, and a bonding process, the same as the LED device of FIG. 3.

Figure 6:
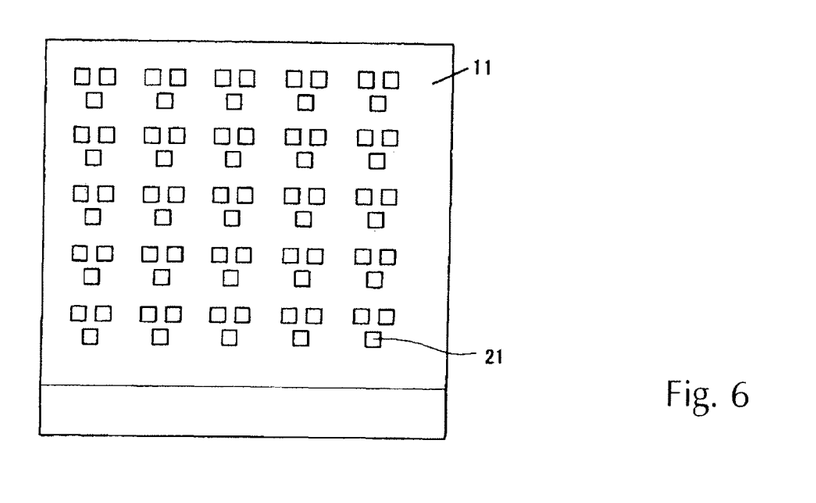
FIG. 6 is an explanatory drawing that shows the state when the Sn layer is formed on the upper surface of the exoergic member in the process of producing the LED device of FIG. 5.

In the exoergic member Sn film formation process here, the Sn film is patterned to correspond to the pattern of LED chip bonding regions on the exoergic member 11, as shown in FIG. 6.

The LED device above is fitted with red light-emitting LED devices 12R, green light-emitting LED devices 12G, and blue light-emitting LED devices 12B; because these LED chips are connected to a common drive circuit 19, this structure makes phosphors unnecessary; it is possible to emit white light by lighting the three varieties of LED chip simultaneously.

By means of this LED device, moreover, it is possible to obtain a variety of colors other than white light, and because it is possible to change the colors of light emitted, variable color lighting becomes possible. In this case, the multiple LED chips will differ in light intensity properties relative to current for each color emitted, and so it becomes necessary to combine either serial circuits or parallel circuits for each color emitted, or in other words, to form a circuit of only red light-emitting LED devices 12R, a circuit of only green light-emitting LED devices 12G, and a circuit of only blue light-emitting LED devices 12B.

Also, by making use of the fact that the multiple LED chips will differ in light intensity properties relative to current for each color emitted in this LED device, it is possible to enhance the color rendering properties particular to lighting.

Figure 7:
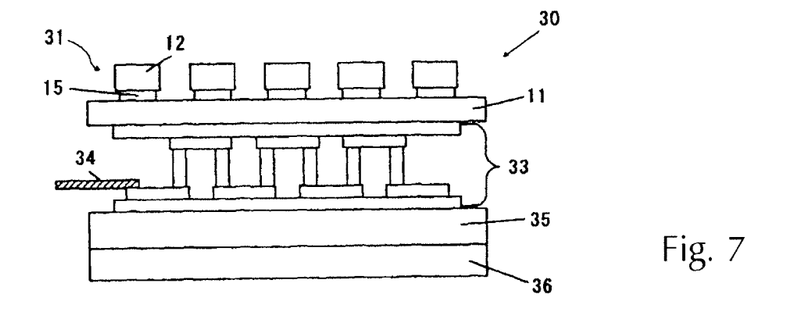
FIG. 7 is an explanatory drawing that shows yet another example of the construction of the LED device of this invention.

This invention is not limited to the embodiments described above; a variety of changes may be applied. For example, the LED device can have a construction that includes a Peltier device 33, as shown in FIG. 7. This LED device 30 has a construction in which the Peltier device 33 is fitted to the lower surface (lower surface in FIG. 7) of an LED device assembly 31 constituted with multiple LED devices 12 bonded to an exoergic member 11. The LED device assembly 31 has the same construction as the LED device of FIG. 3.

In FIG. 7, a heat sink 35 is made of aluminum nitride or copper, a fixture 36 is made of epoxy resin or a metal with high thermal conductivity, such as copper or aluminum, and a lead wire 34 is provided for the Peltier device 33.

An LED device 30 having such a construction can be produced by first using the same exoergic member Sn film formation process, LED chip Au film formation process, mounting process, and bonding process as for the LED device described in conjunction with FIG. 3 to yield an LED device 31 with a construction in which LED devices 12 are bonded by an Au—Sn alloy layer 15 formed on the upper surface of an exoergic member 11, and then, bonding a heat sink 35 to the lower surface of this LED device 31, or in other words, to the lower surface of the exoergic member 11, by means of a bonding agent, such as a silver paste or an Au—Sn alloy paste, and fixing a fixture 36 to the lower surface of the heat sink 35 by a suitable procedure.

By means of such an LED device 30, the heat generated by the LED devices 12 and conducted to the exoergic member 11 across the bonds which are the Au—Sn alloy layer 15 in the LED device assembly 31 is absorbed by the Peltier device 33 and released by the heat sink 35 by way of the Peltier device 33. Thus, efficient heat release of the heat generated by the LED devices 12 is possible.

Figure 8:
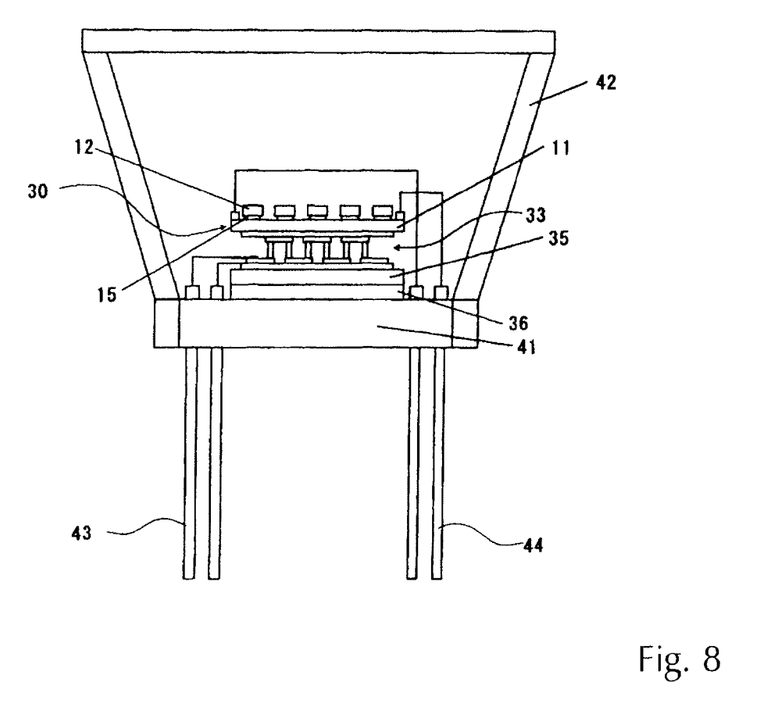
FIG. 8 is an explanatory drawing that shows an example of the construction of lighting equipment that uses the LED device of the invention in FIG. 7 as a light source.

Consequently, an LED device 30 having such a construction provides superior exoergic characteristics, and so it is ideal for use as a light source for such things as display equipment, as shown in FIG. 8.

In FIG. 8, a stem 41, such as a metal-plated stem assembly made of copper that has high thermal conductivity is bonded to the LED device 30, for example, by silver paste. Further, a reflector 42, Peltier terminals 43, and LED terminals 44 are shown in this figure.

In lighting equipment with such a construction, the heat generated from the LED devices 12 that make up the LED device assembly 31 for which an LED device 30 is the light source is conducted to the exoergic member 11 of the LED device assembly 31 itself, the Peltier device 33 for the LED device 30, the heat sink 35, the fixture 36, and the stem 41 of the lighting equipment and is released by means of those constituent parts. Thus, high heat release characteristics are obtained, and it is possible to increase brightness by increasing the number of LED devices 12.

Further, because it is possible to increase brightness by increasing the number of LED devices 12, it is possible to reduce the current supplied to each LED device 12 when brightness is increased, and so it is possible to suppress the generation of heat by the LED devices 12, and as a result, to achieve longer service life and better quality.

A specific embodiment of this invention is explained below, but the invention is not limited by that embodiment.

Embodiment 1

An exoergic member made of an aluminum nitride plate 5 mm long and 5 mm wide was prepared, as were 100 rectangular LED chips 350 μm long and 350 μm wide having a construction of nitride semiconductor layers which were an n-type semiconductor layer of n-GaN, a light-emitting layer of InGaN, and a p-type semiconductor layer of p-GaN, stacked in that order on sapphire substrates.

First, an Au film with a film thickness of 0.2 μm was formed by EB vapor deposition on the lower surface of the sapphire substrate of each of the 100 LED chips.

Further, an Sn film with a film thickness of 3 μm was patterned by EB vapor deposition onto each of 100 LED chip bonding regions on the exoergic member to match the lower surfaces of the LED chips to be bonded, arranged in a lattice shape of ten units vertically by ten units horizontally, separated by gaps of 30 μm.

Next, the LED chips with an Au film formed on their lower surfaces were mounted on the multiple Sn films formed on the upper surface of the exoergic member so that the Au films and Sn films lined up together, after which the exoergic member with multiple LED chips mounted on it was placed in a heat-treatment vessel. The heat-treatment vessel was then filled with a mixture of hydrogen gas and nitrogen gas (hydrogen concentration 5%) at a flow rate of 300 cm$^3$/min; with the heat-treatment vessel filled with the gas mixture, heat treatment was carried out for 10 minutes processing time at 300° C., yielding an LED device constituted with 100 LED chips bonded to the exoergic member.

When the resulting LED device was turned with the surface to which the LED chips were bonded downward, none of the LED chips fell off, and it was confirmed that all 100 LED chips were firmly bonded to the exoergic member.

Further, it was confirmed by EDX analysis (energy diffusion X-ray analysis) that the bonds of the LED device were Au—Sn alloy layers formed with columnar crystals of Au—Sn alloy extending within the Sn layer in a direction perpendicular to the upper surface of the exoergic member.

Moreover, when the LED device obtained was checked for intensity of needle picking, using a needle picking intensity gauge with a weight (g) scale on an acicular body with a sharpened tip and picking the bonds with the needle picking intensity gauge, the measurement was 250 g.

Moreover, after the LED device obtained was heated for 5 minutes at 500° C. in a heating oven, the needle picking intensity was measured again, and the intensity was unchanged.

It was ascertained from the results above that the Au—Sn alloy layer bonds in the LED device had adequate bonding strength, as well as good heat resistance.

Figure 9:
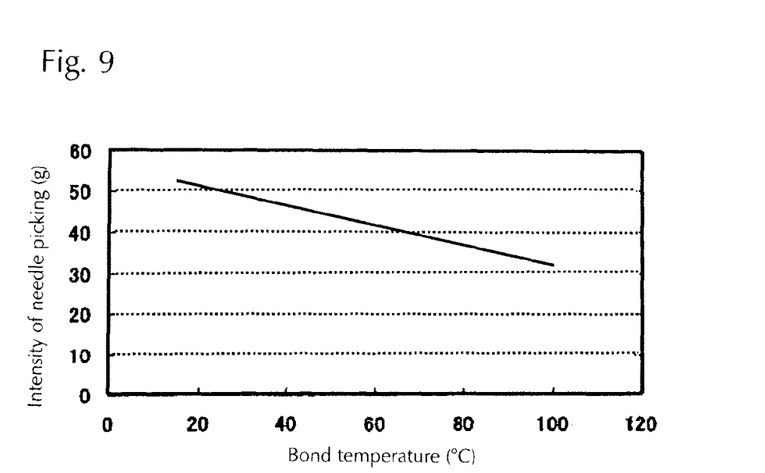
FIG. 9 is a graph that shows the relationship between intensity of needle picking and bonding temperature for a sample with an intensity of needle picking of 50 g.
Figure 10:
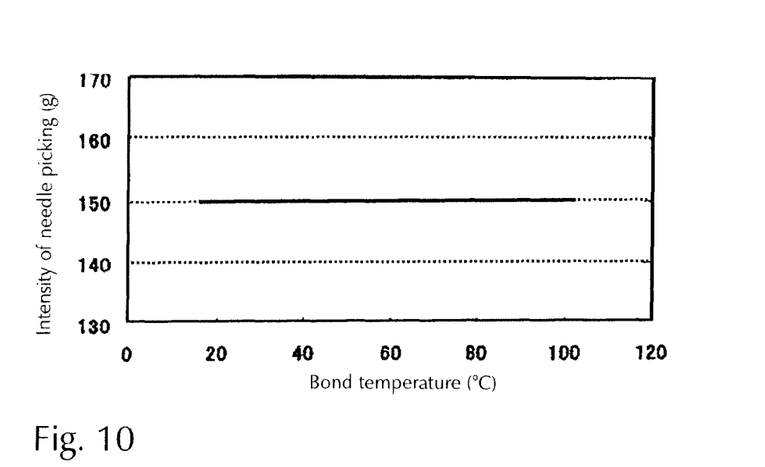
FIG. 10 is a graph that shows the relationship between intensity of needle picking and bonding temperature for a sample with an intensity of needle picking of 150 g.

Using needle picking intensity, it can be confirmed that heat resistance is good when the needle picking intensity is 150 g or greater, as shown in FIGS. 9 and 10.

FIG. 9 is a graph showing the results when samples constituted with LED chips bonded to an exoergic members with Au—Sn alloy bonds were prepared to have a needle picking intensity of 50 g; the needle picking intensity was measured after the samples were heated to check changes in needle picking intensity due to heating temperature, and specifically the temperature of the heated bonds. Further, FIG. 10 is a graph showing the results when samples constituted with LED chips bonded to an exoergic members with Au—Sn alloy bonds were prepared to have a needle picking intensity of 150 g; the needle picking intensity was measured after the samples were heated to check changes in needle picking intensity due to heating temperature, and specifically the temperature of the heated bonds.

From the results in FIGS. 9 & 10, it was ascertained that, for the samples with a needle picking intensity of 50 g, the needle picking intensity declined as the heating temperature increased. For samples with a needle picking intensity of 150 g, on the other hand, it was ascertained that the needle picking intensity did not change with heating. Accordingly, it is understood that when the needle picking intensity is 150 g or more, the bonds have adequate heat resistance.

What is claimed is:

1. An LED device, comprising an LED chip that has been bonded to an Au—Sn alloy layer formed on an upper surface of an exoergic member, columnar crystals being formed within the Au—Sn alloy layer extending in a direction perpendicular to the upper surface of the exoergic member.

2. An LED device as described in claim 1, in which multiple LED chips are bonded to said exoergic member.

3. An LED device as described in claim 2, wherein at least one of the LED chips has a nitride semiconductor layer stacked on an upper surface of a sapphire substrate and wherein a lower surface of the sapphire substrate is bonded to the exoergic member.

4. An LED device as described in claim 2, in which said exoergic member comprises a silicon substrate, and a red light-emitting LED, a green light-emitting LED and a blue light-emitting LED, each of said light-emitting LEDs having been bonded to the upper surface of the silicon substrate.

* * * * *